United States Patent
Lee et al.

(10) Patent No.: US 12,352,498 B2
(45) Date of Patent: Jul. 8, 2025

(54) APPARATUS FOR TREATING SUBSTRATE

(71) Applicant: SEMES CO., LTD., Cheonan-si (KR)

(72) Inventors: Sang Min Lee, Seoul (KR); Seung Hoon Oh, Cheonan-si (KR); Jong Doo Lee, Gyeongju-si (KR); Mi So Park, Daejeon (KR)

(73) Assignee: SEMES CO., LTD., Cheonan-si (KR)

( * ) Notice: Subject to any disclaimer, the term of this patent is extended or adjusted under 35 U.S.C. 154(b) by 809 days.

(21) Appl. No.: 17/564,632

(22) Filed: Dec. 29, 2021

(65) Prior Publication Data
US 2022/0205718 A1     Jun. 30, 2022

(30) Foreign Application Priority Data
Dec. 31, 2020 (KR) .................. 10-2020-0188796

(51) Int. Cl.
*F26B 5/00* (2006.01)
*F26B 5/04* (2006.01)
*H01L 21/67* (2006.01)

(52) U.S. Cl.
CPC .............. *F26B 5/005* (2013.01); *F26B 5/04* (2013.01); *H01L 21/67034* (2013.01)

(58) Field of Classification Search
CPC ....... F26B 5/005; F26B 5/04; H01L 21/67034
USPC .......................................................... 34/336
See application file for complete search history.

(56) References Cited

U.S. PATENT DOCUMENTS

| | | | | |
|---|---|---|---|---|
| 6,988,327 B2* | 1/2006 | Garcia | .............. | H01L 21/67034 216/84 |
| 7,900,373 B2* | 3/2011 | Reitinger | .......... | H01L 21/67109 118/712 |
| 7,980,000 B2* | 7/2011 | Lewis | ............... | H01L 21/68707 34/80 |
| 7,992,318 B2* | 8/2011 | Kawaji | ............... | H01L 21/6838 438/758 |
| 8,898,928 B2* | 12/2014 | Sirard | ................. | H01L 21/6831 118/728 |
| 8,904,668 B2* | 12/2014 | Priebe | ....................... | F26B 3/22 101/450.1 |

(Continued)

FOREIGN PATENT DOCUMENTS

| | | | | |
|---|---|---|---|---|
| CN | 114695194 A | * | 7/2022 | .............. F26B 5/005 |
| JP | 2018-207103 | | 12/2018 | |
| JP | 2022105280 A | * | 7/2022 | .............. F26B 5/005 |
| KR | 101344925 | | 2/2013 | |

(Continued)

OTHER PUBLICATIONS

Notice of Allowance issued by the Japan Patent Office dated Jan. 11, 2023.

*Primary Examiner* — Stephen M Gravini

(57) ABSTRACT

An apparatus for treating the substrate includes a process chamber having a first body and a second body which are combined with each other to have a treating space in which a substrate is treated, and a friction prevention member placed on a contact surface between the first body and the second body. The friction prevention member may have a groove formed at a surface corresponding to the contact surface. An adhesive for adhering the friction prevention member to the first body or adhering the friction prevention member to the second body may be provided in the groove. The groove may form an open-end pattern in which a first end of the open-end pattern is adjacent to a second end of the open-end pattern.

20 Claims, 10 Drawing Sheets

(56) References Cited

U.S. PATENT DOCUMENTS

| | | | |
|---|---|---|---|
| 10,053,778 B2 * | 8/2018 | Parkhe | H01L 21/6831 |
| 2007/0184276 A1 * | 8/2007 | Thiemann | B05D 5/06 |
| | | | 427/398.1 |
| 2019/0096717 A1 | 3/2019 | Lee et al. | |
| 2019/0333759 A1 | 10/2019 | Lee et al. | |
| 2022/0205718 A1 * | 6/2022 | Lee | F26B 5/005 |
| 2022/0208565 A1 * | 6/2022 | Jung | H01L 21/6719 |
| 2023/0035940 A1 * | 2/2023 | Lee | H01L 21/68742 |
| 2023/0184487 A1 * | 6/2023 | Yamaguchi | F26B 3/18 |
| | | | 34/350 |
| 2023/0317422 A1 * | 10/2023 | Takasu | H01J 37/32724 |
| | | | 34/72 |

FOREIGN PATENT DOCUMENTS

| | | |
|---|---|---|
| KR | 101373730 | 2/2013 |
| KR | 101590906 | 6/2015 |
| KR | 10-2015-0078606 | 7/2015 |
| KR | 101910801 | 5/2018 |
| KR | 102041308 | 4/2019 |
| KR | 1020200070172 | 6/2020 |
| KR | 10-2020-0103918 | 9/2020 |
| KR | 20220097732 A * | 7/2022 |

\* cited by examiner

APPARATUS FOR TREATING SUBSTRATE

CROSS-REFERENCE TO RELATED APPLICATIONS

This application claims priority to and the benefit of the Korean Patent Application No. 10-2020-0188796 filed in the Korean Intellectual Property Office on Dec. 31, 2020, the entire contents of which are incorporated herein by reference.

TECHNICAL FIELD

The present invention relates to an apparatus for treating a substrate including a friction prevention member for preventing the friction between process chambers.

BACKGROUND ART

Generally, a semiconductor device is manufactured from a substrate such as a wafer. Specifically, the semiconductor device is manufactured by performing a deposition process, a photolithography process, a cleaning process, a dry process, an etching process, and the like to form a fine circuit pattern on the upper surface of the substrate.

In general, the cleaning process includes chemical treatment of supplying a chemical to the substrate to remove foreign matters on the substrate, rinse treatment of supplying pure water to the substrate to remove the remaining chemical on the substrate, and dry treatment of removing the remaining pure water on the substrate.

A supercritical fluid is used for dry treatment of the substrate. According to an exemplary embodiment, the pure water on the substrate is substituted with an organic solvent and then, in a chamber, the supercritical fluid is supplied to the upper surface of the substrate to dissolve the remaining organic solvent on the substrate and removed from the substrate. When isopropyl alcohol (hereinafter, IPA) is used as the organic solvent, carbon dioxide ($CO_2$) in which critical temperature and critical pressure are relatively low and the IPA is well dissolved is used as the supercritical fluid.

The treating of the substrate using the supercritical fluid is as follows. When the substrate is carried into the chamber, carbon dioxide in a supercritical state is supplied into the chamber to pressurize the inside of the chamber, and then, the substrate is treated with the supercritical fluid while the supply of the supercritical fluid and the exhaust in the chamber are repeated. In addition, when the treating of the substrate is completed, the inside of the chamber is exhausted and decompressed. After the chamber is exhausted, the chamber is opened to remove the substrate and repair the chamber.

Generally, the chambers are combined with each other to be provided as two independent bodies that provide a treating space in which the substrate is treated therein. Each body is made of a metallic material. However, when the bodies are driven, the collision and friction between the bodies occur. Thus, a friction prevention layer for reducing the occurrence of the collision and friction is provided on the contact surface between the bodies. An adhesive is used to fix the friction prevention layer to the contact surface.

The frictional prevention layer is damaged due to the impact with the body when the body is driven. As a result, particles are caused to cause a process defect. In addition, there is a problem that the vacuum pressure is applied between the friction prevention layer and the body due to the high pressure of the treating space to prevent the friction prevention layer and the body from being separated.

SUMMARY OF THE INVENTION

An object of the present invention is to prevent the damage to a friction prevention member provided in a process chamber of treating a substrate while a treating space therein is maintained at high pressure.

In addition, an object of the present invention is to prevent vacuum pressure from being generated in a friction prevention member provided in a process chamber of treating a substrate while a treating space therein is maintained at high pressure.

Other objects of the present invention are not limited to the objects described above, and other objects, which are not mentioned above, will be apparent to those skilled in the art from the following description.

An exemplary embodiment of the present invention, an apparatus for treating the substrate includes a process chamber configured to have a first body and a second body which are combined with each other to have a treating space in which a substrate is treated; and a friction prevention member placed on a contact surface between the first body and the second body. The friction prevention member may have a groove formed on a surface corresponding to the contact surface. An adhesive for adhering the friction prevention member to the first body or adhering the friction prevention member to the second body may be provided in the groove. The groove may be an open-end pattern in which a first end of the groove is adjacent to a second end of the groove.

In the exemplary embodiment, the friction prevention member may have a through hole formed in a region where the groove is not provided.

In the exemplary embodiment, the open-end pattern may form a closed region between the first end and the second end.

In the exemplary embodiment, the closed region may be formed with a through hole that penetrates the friction prevention member.

In the exemplary embodiment, the friction prevention member may be processed with the roughness of the surface corresponding to the contact surface.

In the exemplary embodiment, a compressive stress of the friction prevention member is greater than a force received by the friction prevention member.

In the exemplary embodiment, the adhesion between the adhesive and the friction prevention member may be provided greater than the adhesion between the adhesive and the contact surface.

According to an embodiment of the present invention, an apparatus for treating a substrate including: a process chamber configured to have a first body and a second body which are combined with each other to have a high-pressure treating space in which a substrate is treated; a driver configured to move the process chamber to one of an opening position and a closing position; a support unit configured to support the substrate in the treating space; a fluid supply unit configured to supply a fluid to the treating space; and a friction prevention member provided on a first surface of the process chamber. The first surface includes a contact surface between the first body and the second body. The friction prevention member has a groove formed on a surface corresponding to the contact surface. An adhesive for adhering the friction prevention member to the first body or adhering the friction prevention member to the second body is provided in the groove. The groove is an open-end pattern in which a first end of the groove is adjacent to a second end of the groove.

In the exemplary embodiment, the open-end pattern may form a closed area between the first end and the second end.

In the exemplary embodiment, the closed region may be formed with a through hole that penetrates the friction prevention member.

In the exemplary embodiment, the friction prevention member may have a through hole formed in a region where the groove is not provided.

In the exemplary embodiment, the friction prevention member may be provided in an arc shape.

In the exemplary embodiment, the driver may be provided with a cylinder which penetrates the first body and the second body and elevates any one of the first body and the second body, and the friction prevention member may be provided to cover the cylinder.

In the exemplary embodiment, the friction prevention member may be processed with the roughness of the surface corresponding to the first surface.

In the exemplary embodiment, the process chamber may be provided with a metallic material.

In the exemplary embodiment, the material of the friction prevention member may be provided so that the compressive stress of the friction prevention member is greater than the force received by the friction prevention member.

In the exemplary embodiment, the adhesion between the adhesive and the friction prevention member may be provided greater than the adhesion between the adhesive and the one surface.

In the exemplary embodiment, the apparatus for treating the substrate may further include a clamping member configured to clamp the first body and the second body placed in the closing position, wherein the friction prevention member may be provided between the first body and the clamping member and between the second body and the clamping member, and the first surface may include a contact surface between the first body and the clamping member and a contact surface between the second body and the clamping member.

In the exemplary embodiment, the friction prevention member may be provided in a ring shape.

In the exemplary embodiment, the treating of the substrate may be drying the substrate using a supercritical fluid in the treating space.

According to the exemplary embodiment of the present invention, it is possible to prevent the damage to a friction prevention member provided in a process chamber of treating a substrate while a treating space therein is maintained at high pressure.

In addition, it is possible to prevent vacuum pressure from being generated in a friction prevention member provided in a process chamber of treating a substrate while a treating space therein is maintained at high pressure.

The effect of the present invention is not limited to the foregoing effects, and non-mentioned effects will be clearly understood by those skilled in the art from the present specification and the accompanying drawings.

DETAILED DESCRIPTION

Figure 1:
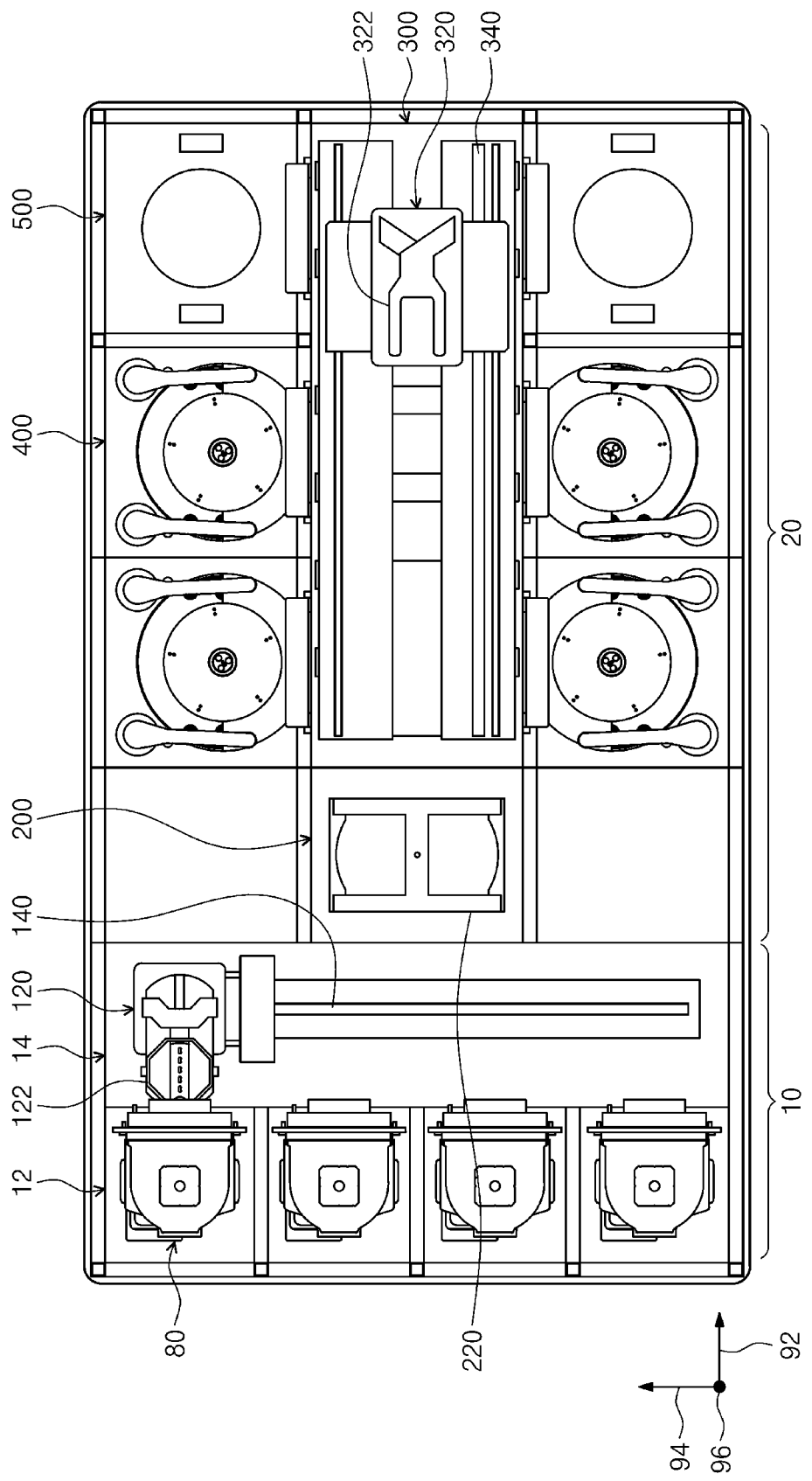
FIG. 1 is a plan view schematically illustrating a substrate treating apparatus according to an exemplary embodiment of the present invention.

Hereinafter, an exemplary embodiment of the present invention will be described in more detail with reference to the accompanying drawings. The exemplary embodiment of the present invention can be modified in various forms, and it should not be construed that the scope of the present invention is limited to exemplary embodiments described below. The exemplary embodiments will be provided to more completely describe the present invention to those skilled in the art. Therefore, shapes, and the like of components in the drawings will be exaggerated to emphasize a more clear description.

FIG. 1 is a plan view schematically illustrating a substrate treating apparatus according to an exemplary embodiment of the present invention. Referring to FIG. 1, a substrate treating system includes an index module 10, a treating module 20, and a controller (not illustrated). According to the exemplary embodiment, the index module 10 and the treating module 20 are disposed along one direction. Hereinafter, a direction in which the index module 10 and the treating module 20 are disposed is defined as a first direction 92, a direction vertical to the first direction 92 when viewed from the top is defined as a second direction 94, and a direction vertical to both the first direction 92 and the second direction 94 is defined as a third direction 96.

The index module 10 conveys a substrate W to the treating module 20 from a container 80 in which the substrate W is received and receives the substrate W which is treated in the treating module 20 in the container 80. The longitudinal direction of the index module 10 is provided as the second direction 94. The index module 10 has a load port 12 and an index frame 14. The load port 12 is positioned on an opposite side of the treating module 20 based on the index frame 14. The container 80 in which the substrates W are received is placed on the load port 12. A plurality of load ports 12 may be provided, and the plurality of load ports 12 may be disposed along the second direction 94.

As the container 80, a closed container such as a front open unified pod (FOUP) may be used. The container 80 may be placed on a conveying means (not illustrated) such as an overhead transfer, an overhead conveyor, or an automatic guided vehicle or the load port 12 by an operator.

An index robot 120 is provided in the index frame 14. In the index frame 14, a guide rail 140 of which the longitudinal direction is provided as the second direction 94 is provided, and the index robot 120 may be provided to be movable on the guide rail 140. The index robot 120 includes a hand 122 on which the substrate W is placed, and the hand 122 may be provided to move forward and backward, rotate on an axis of the third direction 96, and be movable along the third direction 96. A plurality of hands 122 is provided so as to be spaced apart from each other in a vertical direction, and the hands 122 may move forward and backward independently of each other.

The treating module 20 includes a buffer unit 200, a conveying device 300, a liquid treating device 400, and a supercritical device 500. The buffer unit 200 provides a space where the substrate W carried into the treating module 20 and the substrate W carried out from the treating module 20 temporarily stay. The liquid treating device 400 performs a liquid treating process of supplying a liquid onto the substrate W to liquid-treat the substrate W. The supercritical device 500 performs a drying process of removing the remaining liquid on the substrate W. The conveying device 300 conveys the substrate W between the buffer unit 200, the liquid treating device 400, and the supercritical device 500.

The longitudinal direction of the conveying device 300 may be provided in the first direction 92. The buffer unit 200 may be disposed between the index module 10 and the conveying device 300. The liquid treating device 400 and the supercritical device 500 may be disposed on the side portion of the conveying device 300. The liquid treating device 400 and the conveying device 300 may be disposed along the second direction 94. The supercritical device 500 and the conveying device 300 may be disposed along the second direction 94. The buffer unit 200 may be positioned at one end of the conveying device 300.

According to the exemplary embodiment, the liquid treating devices 400 are disposed on both sides of the conveying device 300, the supercritical devices 500 are disposed on both sides of the conveying device 300, and the liquid treating devices 400 may be disposed at positions closer to the buffer unit 200 than the supercritical devices 500. On one side of the conveying device 300, the liquid treating devices 400 may be provided in an array of A×B (A and B are natural numbers of 1 or greater than 1, respectively) along the first direction 92 and the third direction 96, respectively. On one side of the conveying device 300, the supercritical devices 500 may be provided in C×D (C and D are natural numbers of 1 or greater than 1, respectively) along the first direction 92 and the third direction 96, respectively. Unlike this, on one side of the conveying device 300, only the liquid treating devices 400 may be provided, and on the other side of the conveying device 300, only the supercritical devices 500 may be provided.

The conveying device 300 has a conveying robot 320. In the conveying device 300, a guide rail 340 of which the longitudinal direction is provided as the first direction 92 is provided, and the conveying robot 320 may be provided to be movable on the guide rail 340. The conveying robot 320 includes a hand 322 on which the substrate W is placed, and the hand 322 may be provided to move forward and backward, rotate on an axis of the third direction 96, and be movable along the third direction 96. A plurality of hands 322 is provided so as to be spaced apart from each other in a vertical direction, and the hands 322 may move forward and backward independently of each other.

The buffer unit 200 includes a plurality of buffers 220 on which the substrate W is placed. The buffers 220 may be disposed to be spaced apart from each other along the third direction 96. The buffer unit 200 is opened with a front face and a rear face. The front face is a face facing the index module 10, and the rear face is a face facing the conveying device 300. The index robot 120 approaches the buffer unit 200 through the front face, and the conveying robot 320 may approach the buffer unit 200 through the rear face.

Figure 2:
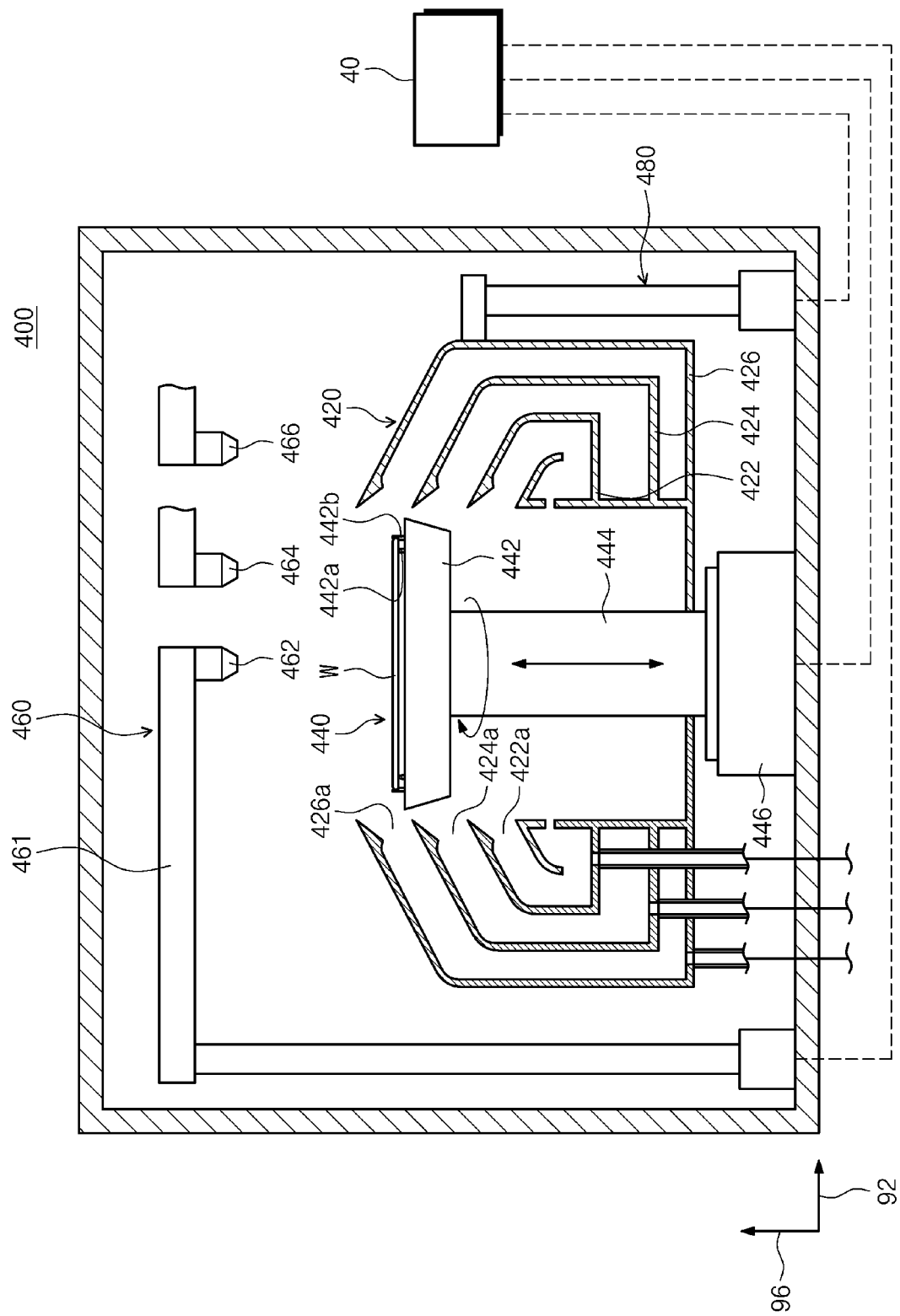
FIG. 2 is a cross-sectional view schematically illustrating an example of a liquid treating device of FIG. 1.

FIG. 2 is a diagram schematically illustrating an example of the liquid treating device 400 of FIG. 1. Referring to FIG. 2, the liquid treating device 400 has a housing 410, a cup 420, a support unit 440, a liquid supply unit 460, an elevating unit 480, and a controller 40. The controller 40 controls the operation of the liquid supply unit 460, the support unit 440, and the elevating unit 480. The housing 410 is provided in a substantially cuboid shape. The cup 420, the support unit 440, and the liquid supply unit 460 are disposed in the housing 410.

The cup 420 has a treating space with an opened upper portion, and the substrate W is liquid-treated in the treating space. The support unit 440 may support the substrate W in the treating space. The liquid supply unit 460 supplies a liquid onto the substrate W supported by the support unit 440. A plurality of types of liquids is provided and may be sequentially supplied onto the substrate W. The elevating unit 480 controls the relative height between the cup 420 and the support unit 440.

According to the exemplary embodiment, the cup 420 has a plurality of recovery tanks 422, 424, and 426. The recovery tanks 422, 424, and 426 have recovery spaces that recover the liquid used for the substrate treatment, respectively. Each of the recovery tanks 422, 424, and 426 is provided in a ring shape of covering the support unit 440. A pre-treating liquid scattered by the rotation of the substrate W when the liquid treating process is performed is introduced into the recovery space through inlets 422a, 424a, and 426a of the recovery tanks 422, 424, and 426. According to the exemplary embodiment, the cup 420 has a first recovery tank 422, a second recovery tank 424, and a third recovery tank 426. The first recovery tank 422 is disposed to cover the support unit 440, the second recovery tank 424 is disposed to cover the first recovery tank 422, and the third recovery tank 426 is disposed to cover the second recovery tank 424. The second inlet 424a introducing the liquid to the second recovery tank 424 may be positioned above the first inlet 422a introducing the liquid to the first recovery tank 422, and the third inlet 426a introducing the liquid to the third recovery tank 426 may be positioned above the second inlet 424a.

The support unit 440 has a support plate 442 and a drive shaft 444. The upper surface of the support plate 442 is provided in a substantially circular shape and may have a diameter greater than the substrate W. At the central portion of the support plate 442, a support pin 442a supporting the rear surface of the substrate W is provided, and the upper end of the support pin 442a is provided to protrude from the support plate 442 so that the substrate W is spaced apart from the support plate 442 at a predetermined distance. A chuck pin 442b is provided in the edge portion of the support plate 442.

The chuck pin 442b is provided to protrude upward from the support plate 442, and supports the side portion of the substrate W so that the substrate W is not deviated from the support unit 440 when the substrate W is rotated. The drive shaft 444 is driven by a driving member 446 and is connected to the center of the substrate W, and rotates the support plate 442 based on its central axis.

According to the exemplary embodiment, the liquid supply unit 460 has a first nozzle 462, a second nozzle 464, and a third nozzle 466. The first nozzle 462 supplies a first liquid onto the substrate W. The first liquid may be a liquid for removing a film or foreign matters remaining on the substrate W. The second nozzle 464 supplies a second liquid onto the substrate W. The second solution may be a liquid well-dissolved in a third liquid. For example, the second liquid may be a liquid that is better dissolved in the third solution than the first liquid. The second liquid may be a liquid that neutralizes the first liquid supplied on the substrate W. Further, the second liquid may be a liquid that neutralizes the first liquid and is better dissolved in the third solution than the first liquid.

According to the exemplary embodiment, the second liquid may be water. The third nozzle 466 supplies a third liquid onto the substrate W. The third liquid may be a liquid that is well dissolved in the supercritical fluid used in the supercritical device 500. For example, the third liquid may be a liquid that is better dissolved in the supercritical fluid used in the supercritical device 500 than the second liquid. According to the exemplary embodiment, the third liquid may be an organic solvent. The organic solvent may be isopropyl alcohol (IPA). According to the exemplary embodiment, the supercritical fluid may be carbon dioxide.

The first nozzle 462, the second nozzle 464, and the third nozzle 466 are supported by different arms 461, and these arms 461 may be moved independently. Optionally, the first nozzle 462, the second nozzle 464, and the third nozzle 466 may be mounted on the same arm and may be moved simultaneously.

The elevating unit 480 moves the cup 420 in a vertical direction. The relative height between the cup 420 and the substrate W is changed by the vertical movement of the cup 420. As a result, since the recovery tanks 422, 424, and 426 for recovering the pre-treating liquid are changed according to a type of liquid supplied to the substrate W, the liquids may be separately recovered. Unlike described above, the cup 420 is fixed and the elevating unit 480 may move the support unit 440 in a vertical direction.

Figure 3:
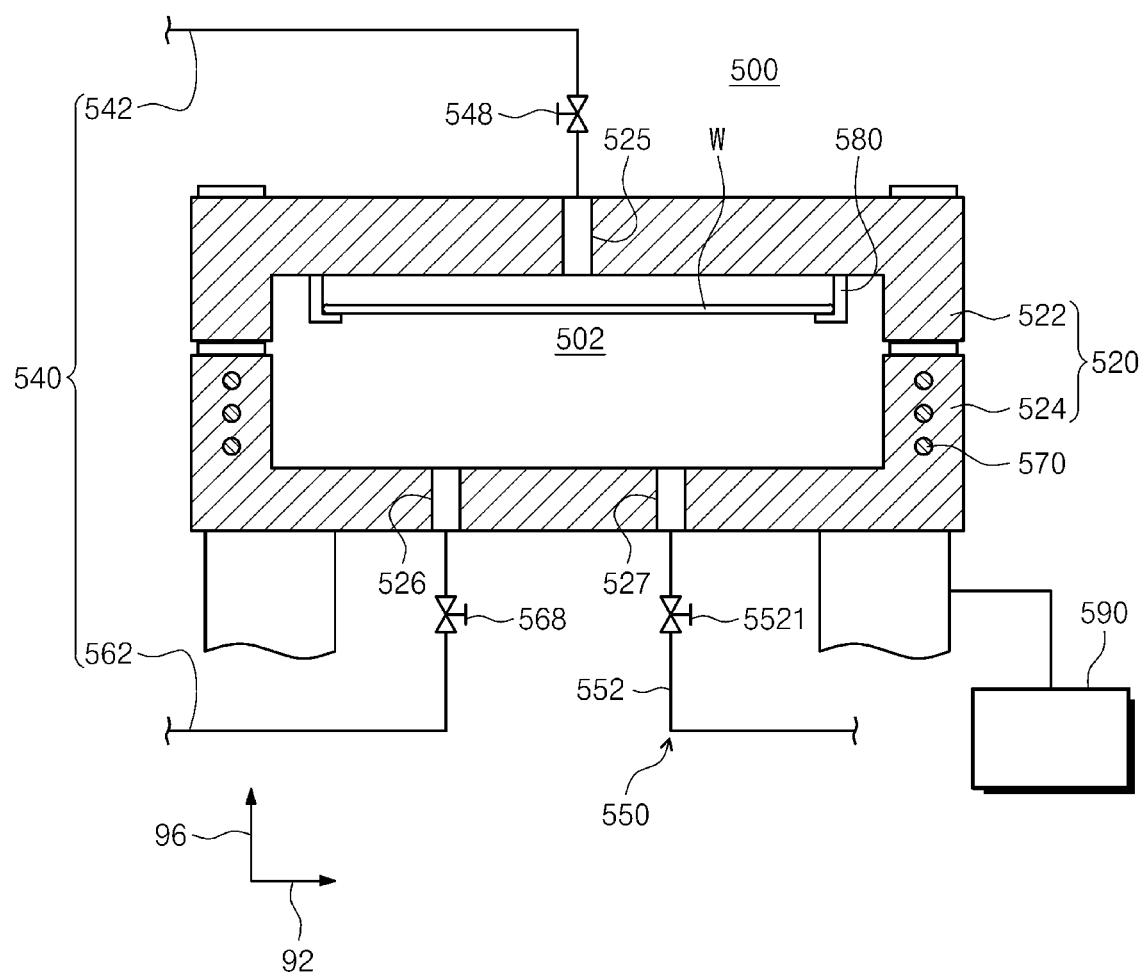
FIGS. 3 and 4 are cross-sectional views schematically illustrating an example of a supercritical device of FIG. 1, respectively.
Figure 4:
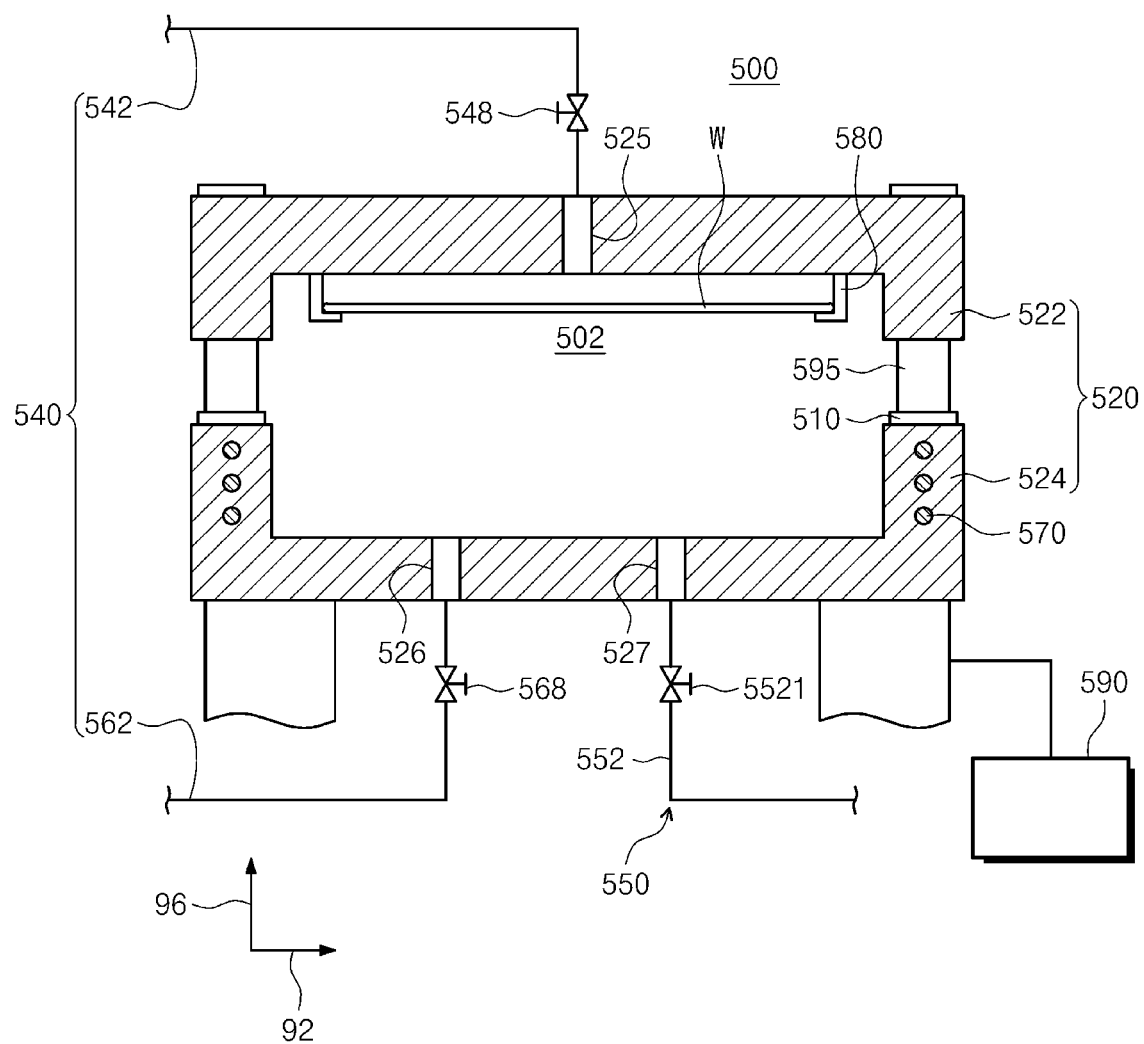

FIGS. 3 and 4 are cross-sectional views schematically illustrating an example of the supercritical device 500 of FIG. 1, respectively. According to the exemplary embodiment, the supercritical device 500 removes the liquid on the substrate W using a supercritical fluid. According to the exemplary embodiment, the liquid on the substrate W is isopropyl alcohol (IPA). The supercritical device 500 supplies the supercritical fluid onto the substrate to dissolve the IPA on the substrate W in the supercritical fluid and remove the IPA from the substrate W.

Referring to FIGS. 3 and 4, the supercritical device 500 includes a process chamber 520, a fluid supply line 540, a support unit 580, a driving member 590, and an exhaust unit 550.

The process chamber 520 has a treating space 502 in which a supercritical process is performed. In the exemplary embodiment, the process chamber 520 may be provided in a cylindrical shape. Alternatively, unlike this, the process chamber 520 may be provided in a cuboid shape. The process chamber 520 has a first body 522 and a second body 524. The first body 522 and the second body 524 are combined with each other to provide the treating space 502 described above. In the exemplary embodiment, the first body 522 is provided in a circular shape when viewed from the top. Similarly, the second body 524 is provided in a circular shape when viewed from the top. In the exemplary embodiment, the first body 522 is provided on the second body 524. Optionally, the first body 522 and the second body 524 may be provided to the same height, and the first body 522 and the second body 524 may be opened and closed to the left and right.

When the first body 522 is spaced apart from the second body 524, the treating space 502 is opened, and at this time, the substrate W is carried in or out. The driving member 590 elevates either the first body 522 or the second body 524 so that the process chamber 520 is moved to an opening position or a closing position.

In the exemplary embodiment, the driving member 590 may be provided to drive a cylinder 595 that elevates the first body 522 or the second body 524. For example, the driving member 590 may be provided to elevate the second body 524. Here, the opening position is a position where the first body 522 and the second body 524 are spaced apart from each other, and the closing position is a position where contact surfaces of the first body 522 and the second body 524 facing each other are in contact with each other. That is, at the opening position, the treating space 502 is opened from the outside, and at the closing position, the treating space 502 is closed.

In the exemplary embodiment, a first ejection hole 525 to which the first supply line 542 is connected may be formed in the first body 522. A fluid may be supplied to the treating space 502 through the first ejection hole 525. In the exemplary embodiment, in the second body 524, a second ejection hole 526 to which the second supply line 562 is connected and an exhaust hole 527 to which the exhaust line 552 is connected may be formed. Optionally, only one of the first ejection hole 525 and the second ejection hole 526 may be provided in the process chamber 520. In the exemplary embodiment, a heater 570 is provided inside the wall of the process chamber 520. The heater 570 heats the treating space 502 of the process chamber 520 to maintain the fluid supplied into the inner space of the process chamber 520 in the supercritical state. The atmosphere by the supercritical fluid is formed inside the treating space 502.

The support unit 580 may support the substrate W in the treating space 502 of the process chamber 520. The substrate W carried into the treating space 502 of the process chamber 520 is placed on the support unit 580. According to the exemplary embodiment, the substrate W is supported by the support unit 580 so that a pattern surface faces the top. In the exemplary embodiment, the support unit 580 supports the substrate W above the second ejection hole 526. In the exemplary embodiment, the support unit 580 may be coupled to the first body 522. Optionally, the support unit 580 may be coupled to the second body 524.

In addition, the exhaust unit 550 is coupled to the second body 524. The supercritical fluid in the treating space 502 of the process chamber 520 is exhausted to the outside of the process chamber 520 through the exhaust unit 550. The exhaust unit 550 includes an exhaust line 552 and an exhaust valve 5521. The exhaust valve 5521 is provided on the exhaust line 552 to adjust the exhaust of the treating space 502 and an exhaust flow rate.

When the process is performed, the first body 522 and the second body 524 are in contact with each other to close the treating space 502 from the outside.

In the exemplary embodiment, the first body 522 and the second body 524 are provided with metallic materials. For example, the first body 522 and the second body 524 may be provided with stainless. While the first body 522 and the second body 524 are in contact with each other, the impact and vibration are generated on the contact surface between the first body 522 and the second body 524. Accordingly, a friction prevention member 510 (i.e., a friction prevention layer) is provided to reduce the impact and vibration generated on the contact surface between the first body 522 and the second body 524.

Figure 5:
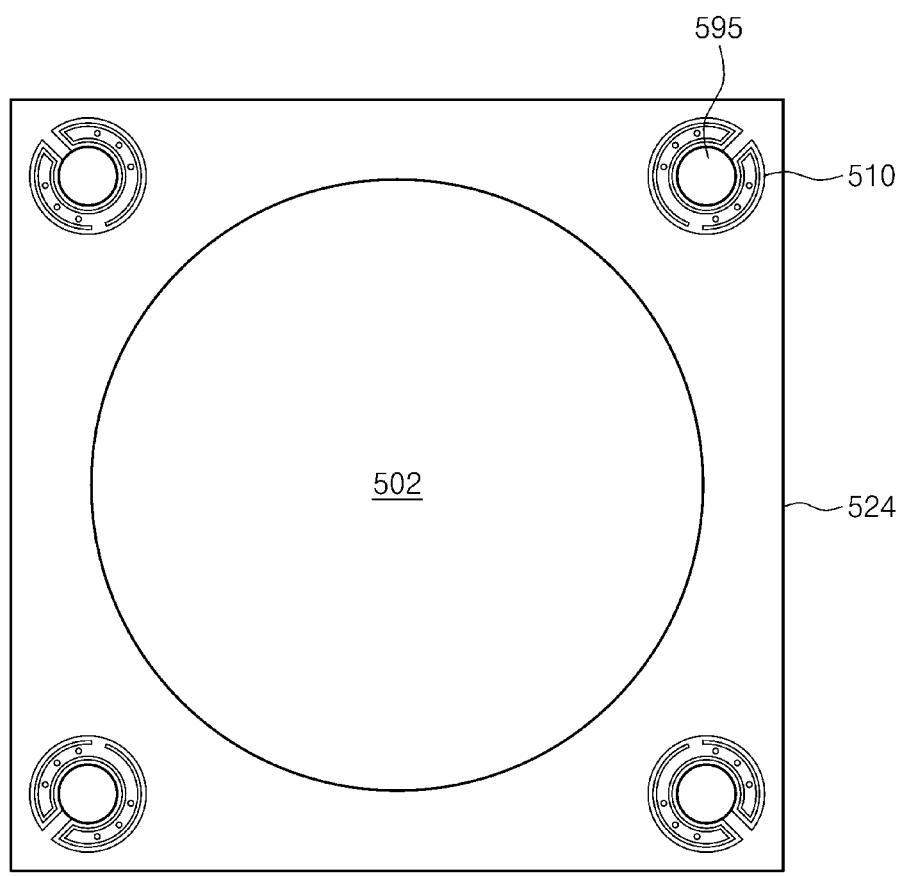
FIG. 5 is a plan view schematically illustrating a state where a friction prevent member is placed on a second body according to an exemplary embodiment of the present invention.
Figure 6:
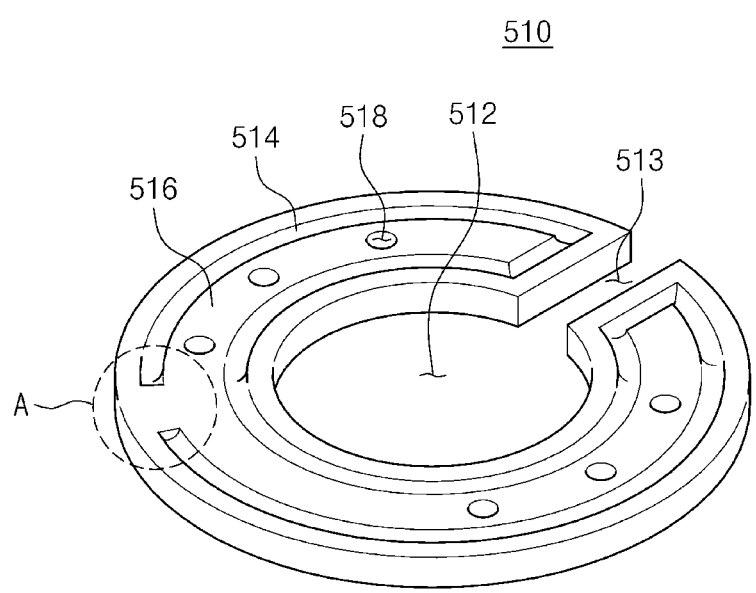
FIG. 6 is a perspective view schematically illustrating an appearance of the friction prevent member according to the exemplary embodiment of the present invention.

Hereinafter, the friction prevention member 510 of the present invention will be described with reference to FIGS. 5 and 6. FIG. 5 is a plan view schematically illustrating a state in which the friction prevention member 510 according to the exemplary embodiment of the present invention is placed on the second body 524 and FIG. 6 is a perspective view schematically illustrating an appearance of the friction prevention member 510 according to the exemplary embodiment of the present invention.

In the exemplary embodiment, the friction prevention member 510 is provided on the contact surface between the first body 522 and the second body 524. In the exemplary embodiment, the friction prevention member 510 is placed on the second body 524 as illustrated in FIG. 5.

The friction prevention member 510 prevents the first body 522 and the second body 524 from directly colliding with each other. Thus, the friction prevention member 510 prevents particles from being generated due to the collision of the first body 522 and the second body 524. In the exemplary embodiment, the friction prevention member 510 is provided as a stable material to the process fluid supplied to the treating space 502. In the exemplary embodiment, carbon dioxide in a supercritical state is provided to the treating space 502 to dry the substrate, and the friction prevention member 510 is provided with any one of polyimide (PI), polyetheretherketone (PEEK), polyethylene terephthalate (PET), zirconia, silicon carbide (SiC), silicon nitride (SiN), and aluminum oxide (alumina). In the exemplary embodiment, the friction prevention layer 510 has a thickness of 0.5 mm to 3 mm.

The cylinder 595 elevates the process chamber 520, wherein the collision between the process chamber 520 and the cylinder 595 is frequent in the vicinity of the cylinder 595. Therefore, the friction prevention member 510 may be provided in the vicinity of the cylinder 595. In the exemplary embodiment, the friction prevention member 510 may be provided to cover the cylinder 595. For example, the friction prevention member 510 may be provided in a ring shape. The friction prevention member 510 has a hollow 512 and is provided with an opening 513 so that a region where the hollow 512 is provided may be fitted to the cylinder 595 through the opening 513.

In the exemplary embodiment, the friction prevention member 510 may be formed with a groove 514 at the surface corresponding to the contact surface as illustrated in FIG. 6. The groove 514 is provided with an adhesive for adhering between the friction prevention member 510 and the first body 522 or between the friction prevention member 510 and the second body 524. In the exemplary embodiment, the adhesive is provided with a material that enhances the contact force of the process chamber 520 provided with metal and the friction prevention member 510. In the exemplary embodiment, the adhesive is provided with a material having a high contact with a metallic material. In the exemplary embodiment, the adhesive may be provided with a material having a high contact with a metallic material and excellent high temperature performance. For example, the adhesive may be provided with an acrylic material. In the exemplary embodiment, the adhesive may be provided in a form such as a double-sided tape. Optionally, the adhesive may be provided as a liquid coated in the groove 514. In the exemplary embodiment, the adhesive adheres between the groove 514 and the first body 522. Optionally, the adhesive adheres between the groove 514 and the second body 524. The groove 514 forms a predetermined pattern in the friction prevention member 510. In the exemplary embodiment, the groove 514 forms an open-end pattern in which a first end of the groove 514 is adjacent to a second end of the groove 514. For example, as illustrated in FIG. 6, the pattern in which the groove 514 is formed is opened in a region A. As a result, a region 516 in which the groove 514 is not provided is isolated by the groove 514 to prevent vacuum pressure from occurring. Thus, the groove 514 prevents the process chamber 520 and the friction prevention member 510 from being not separated by the vacuum pressure if necessary.

In the exemplary embodiment, the friction preventing member 510 may be formed with a through hole 518 in the region 516 in which the groove 514 is not provided. Thus, the friction preventing member 510 prevents the vacuum pressure from being generated in the region 516 in which the groove 514 is not provided. In the exemplary embodiment, the pattern may form a closed region between one end and the other end. A plurality of closed regions may be formed. A through hole 518 may be formed in an area surrounded by the closed regions.

In the exemplary embodiment, the friction prevention member 510 may be processed with the roughness of the surface corresponding to the contact surface. For example, the roughness of the upper surface and the lower surface of the friction prevention member 510 may be processed. The roughness of the upper surface and the lower surface of the friction prevention member 510 may be processed to have the roughness so as not to generate the vacuum pressure between the friction prevention member 510 and the process chamber 520.

In the exemplary embodiment, the material of the friction prevention member 510 may be provided so that the compressive stress of the friction prevention member 510 is greater than the force received by the friction prevention member 510. In the exemplary embodiment, the compressive stress of the friction prevention member 510 may be greater than a value obtained by multiplying the area of the friction prevention member 510, the number of friction prevention members 510, and a force generated in the treating space 502. For example, the area of the friction prevention member 510, the number of friction prevention members 510, and the material of the friction prevention member 510 may be determined according to the above conditions.

In the exemplary embodiment, the adhesion between the adhesive and the friction preventing member 510 may be provided greater than the adhesion between the adhesive and the contact surface. For example, the adhesive is provided in a double, and the adhesion of the surface in contact with the friction prevention member 510 may be provided greater than the adhesion of the surface in contact with the process chamber 520. Optionally, the adhesive is provided as a single layer, and the material of the adhesive may be selected so that the adhesion between the adhesive and the friction prevention member 510 is greater than the adhesion between the adhesive and the process chamber.

Figure 7:
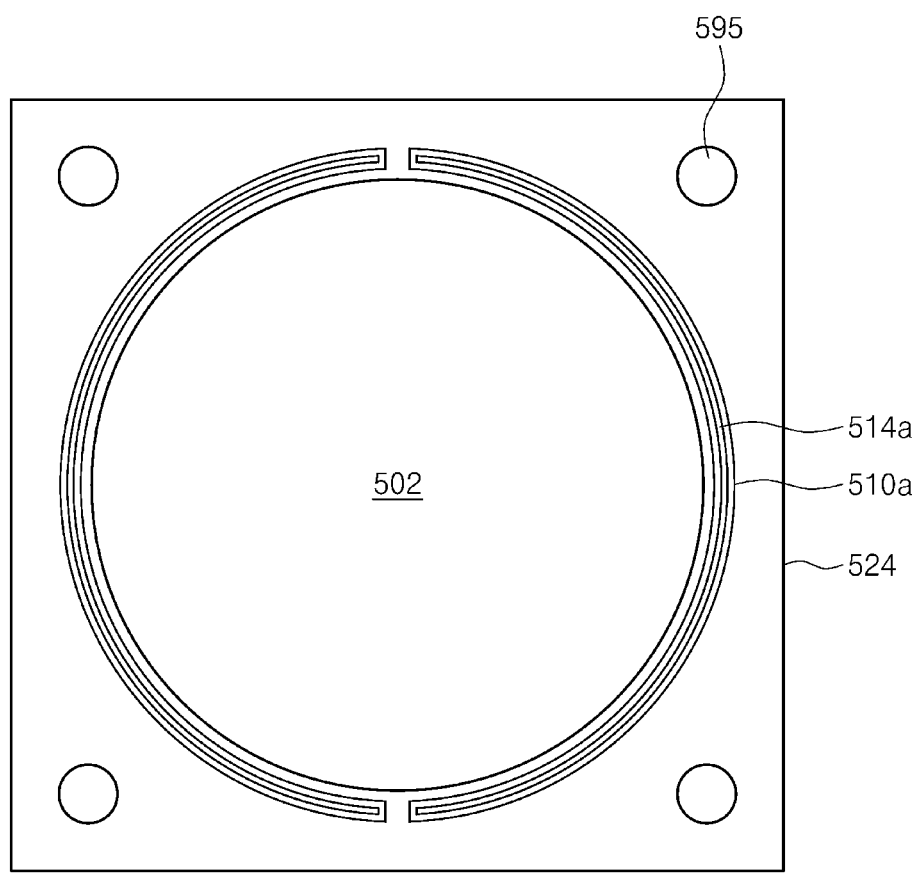
FIGS. 7 and 8 are diagrams schematically illustrating a state where a friction prevent member is placed on a second body according to an exemplary embodiment of the present invention, respectively.
Figure 8:
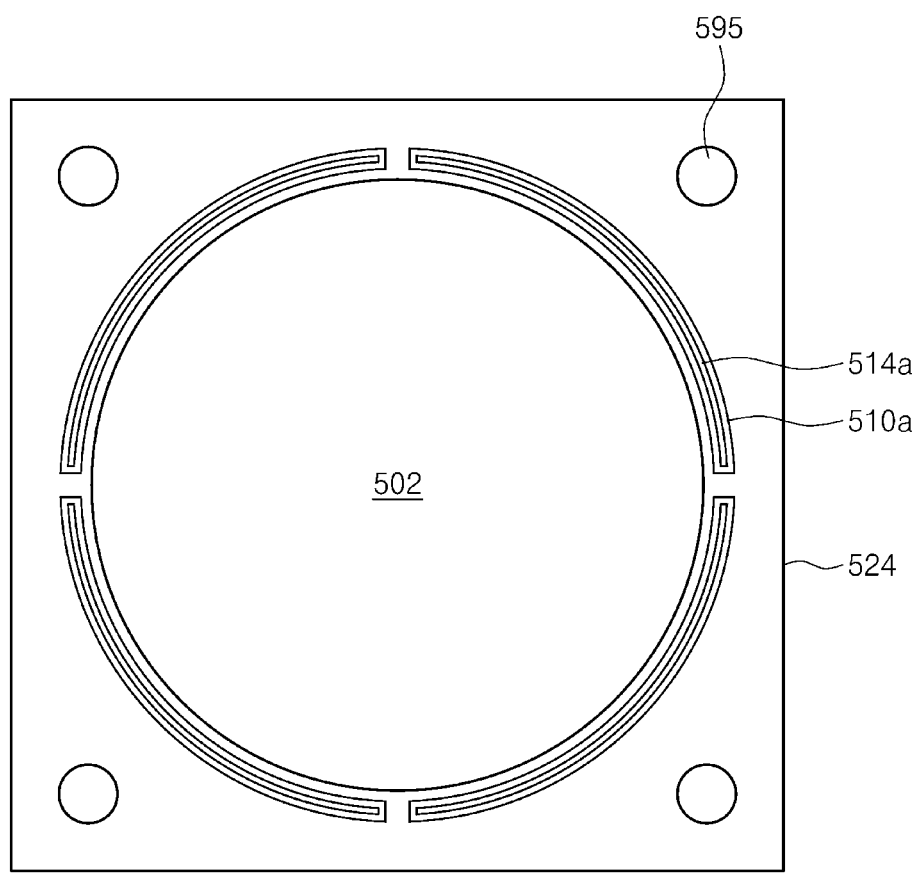

In the exemplary embodiment, it has been described that the friction prevention member 510 is provided in a ring shape in the vicinity of the cylinder 595. However, unlike this, the friction prevention member 510 may be provided in an arc shape as illustrated in FIGS. 7 and 8.

In the exemplary embodiment, it has been described that the friction prevention member 510 is provided between the first body 522 and the second body 524. However, unlike this, the friction prevention member 510 may be provided between a clamping member 5000 clamping the process chamber 520 and the process chamber 520.

Figure 9:
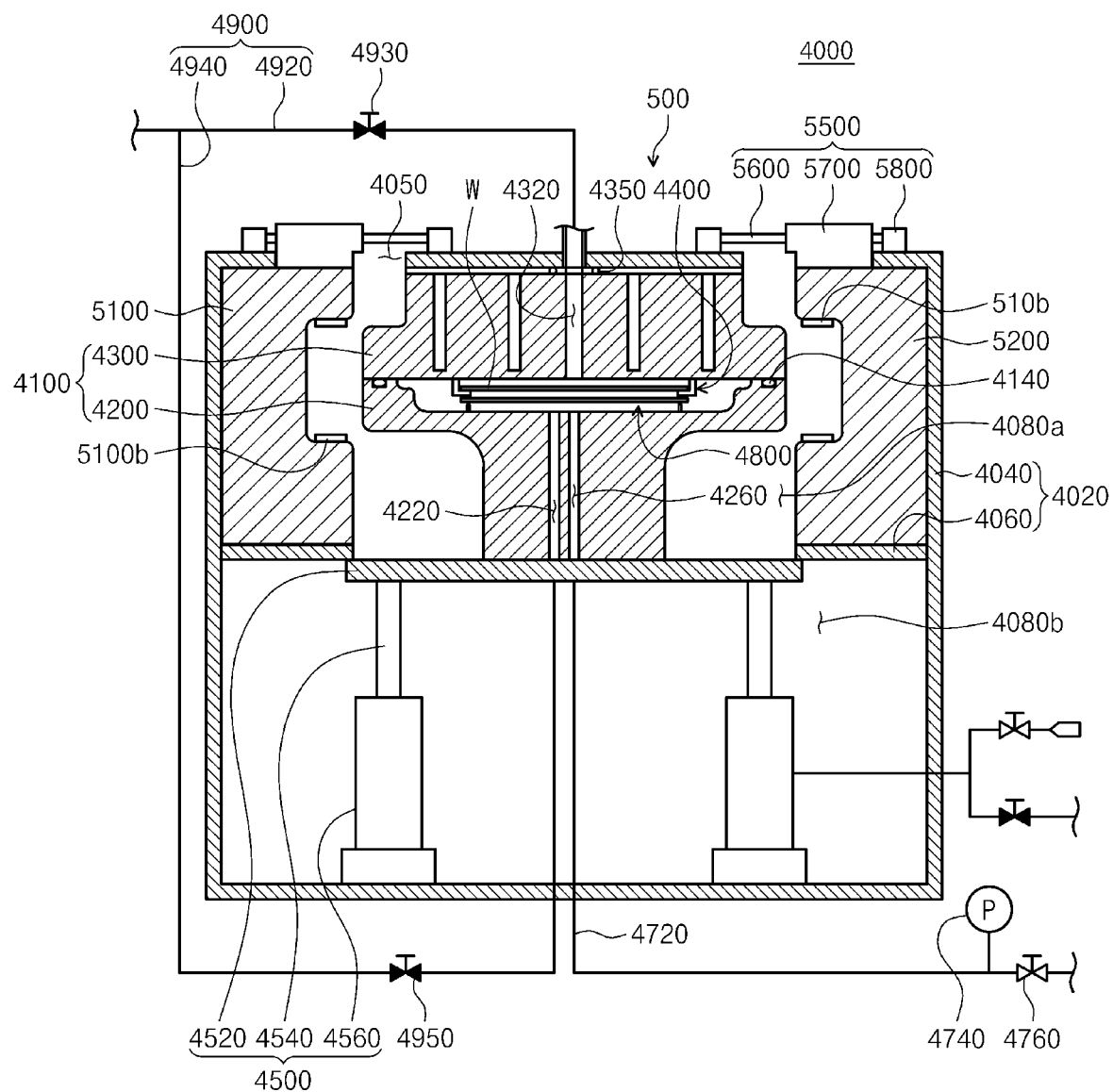
FIG. 9 is a cross-sectional view schematically illustrating an appearance of a supercritical device according to an exemplary embodiment of the present invention.

FIG. 9 illustrates an exemplary embodiment of a substrate treating apparatus of the present invention.

Referring to FIG. 9, in the exemplary embodiment, a substrate treating apparatus 4000 includes a housing 4020, a process chamber 4100, a substrate support unit 4400, an elevating member 4500, a heating member 4600, a blocking member 4800, an exhaust unit 4700, a fluid supply unit 4900, a clamping member 5000, and a moving member 5500. In the exemplary embodiment, the process chamber 4100 may be provided as the process chamber 520 illustrated in FIG. 3.

The housing 4020 includes a body 4040 and an intermediate plate 4060. The body 4040 is provided in a cylindrical shape having a space therein. For example, the body 4040 may be provided in a cuboid shape. Slit-shaped through holes 4050 are formed in the upper surface of the body 4040. The through holes 4050 are provided to have the same longitudinal direction as each other at different positions from each other. The intermediate plate 4060 is positioned in the body 4040. The intermediate plate 4060 partitions the inside of the body 4040 into an upper space 4080a and a lower space 4080b. The intermediate plate 4060 is provided in a plate shape having a hollow 4040a. The second body 4200 is provided to be insertable into the hollow 4040a. The hollow 4040a may be provided to have a diameter greater than the lower end of the second body 4200. The process chamber 4100 and the clamping member 5000 may be positioned in the upper space 4080a, and the elevating member 4500 may be positioned in the lower space 4080b. The moving member 5500 may be positioned on the outer wall of the housing 4020.

The process chamber 4100 has a treating space 4120 for treating the substrate W therein. The process chamber 4100 closes the treating space 4120 from the outside while treating the substrate W. The process chamber 4100 includes a second body 4200, a first body 4300, and a sealing member 4140. The lower surface of the second body 4200 is provided to be stepped. The second body 4200 is provided in a shape where the central portion of the lower surface is positioned lower than the edge portion thereof. For example, the second body 4200 may be provided in a substantially cylindrical shape. The second body 4200 can be elevated to the upper space 4080a and the lower space 4080b of the body 4040 by the elevating member 4500. A lower supply port 4220 and an exhaust port 4260 are formed on the lower surface of the second body 4200. When viewed from the top, the lower supply port 4220 may be positioned out of the center axis of the second body 4200. The lower supply port 4220 functions as a flow channel for supplying the supercritical fluid to the treating space 4120.

The first body 4300 is combined with the second body 4200 to form the treating space 4120 therein. The first body 4300 is positioned on the second body 4200. The first body 4300 is positioned in the upper space 4080a of the housing 4020. The first body 4300 is coupled to a ceiling surface of the body 4040 by a buffer member 4350. For example, the buffer member 4350 may be a spring. An upper supply port 4320 is formed in the first body 4300. The upper supply port 4320 functions as a flow channel for supplying the supercritical fluid to the treating space 4120. The upper supply port 4320 may be positioned to be consistent with the center of the first body 4300. According to the exemplary embodiment, each of the first body 4300 and the second body 4200 may be provided with a metallic material.

The sealing member 4140 seals a gap between the first body 4300 and the second body 4200. The sealing member 4140 is positioned between the first body 4300 and the second body 4200. The substrate support unit 4400 may support the substrate W in the treating space 4120.

The elevating member 4500 adjusts a relative position between the first body 4300 and the second body 4200. The elevating member 4500 elevates any one of the first body 4300 and the second body 4200 to be spaced apart from or in contact with the other one thereof. The elevating member 4500 elevates either the first body 4300 or the second body 4200 so that the process chamber 4100 is moved to an opening position or a closing position. The elevating member 4500 includes a support plate 4520, an elevating shaft 4540, and a driver 4560. The support plate 4520 supports the second body 4200 in the lower space 4080b. The elevating shaft 4540 supports the lower surface of the support plate 4520 in the lower space 4080b. The elevating shaft 4540 is fixedly coupled to the support plate 4520. The driver 4560 elevates the elevating shaft 4540. When the driving force is provided to the driver 4560, the second body 4200 and the elevating shaft 4540 are elevated, and the first body 4300 and the second body 4200 move to the closing position where the treating space is sealed. When the driving force of the driver 4560 is released in the closing position, the first body 4300 and the second body 4200 may maintain the closing position.

The blocking member 4800 prevents the supercritical fluid supplied from the lower supply port 4220 from being directly supplied to a non-treated surface of the substrate W. The blocking member 4800 includes a blocking plate 4820 and a supporter 4840. The blocking plate 4820 is positioned between the lower supply port 4220 and the substrate support unit 4400. The supporter 4840 supports the blocking plate 4820.

The exhaust unit 4700 may exhaust the atmosphere of the treating space 4120. The process by-products generated in the treating space 4120 are exhausted through the exhaust unit 4700. The exhausts may be natural exhaust or forced exhaust. In addition, the exhaust unit 4700 may also adjust the pressure of the treating space 4120 while exhausting the process by-products. The exhaust unit 4700 includes an exhaust line 4720 and a pressure measuring member 4740. The exhaust line 4720 is connected with the exhaust port 4260. The exhaust valve 4760 provided in the exhaust line 4720 can adjust the exhaust amount of the treating space 4120. The pressure measuring member 4740 is provided on the exhaust line 4720, and measures the pressure of the exhaust line 4720. The pressure measuring member 4740 is positioned upstream of the exhaust valve 4760 in an exhaust direction. The treating space 4120 may be decompressed to normal pressure or pressure corresponding to the outside of the process chamber 4100 by the exhaust unit 4700.

A first clamp 5100 and a second clamp 5200 are positioned on the side portion of the process chamber 4100. According to the exemplary embodiment, the first clamp 5100 and the second clamp 5200 are positioned to face each other with the process chamber 4100 therebetween. Each of the first clamp 5100 and the second clamp 5200 is provided in a shape of covering the process chamber 4100.

Each of the first clamp 5100 and the second clamp 5200 has a clamp groove 5120 formed on an inner surface facing the process chamber 4100. The clamp groove 5120 is insertable with the edge portion of the first body 4300 and the edge portion of the second body 4200 positioned in the closing position. The clamping member 5000 is movable to a locking position or a releasing position. Here, the locking position is defined as a position where the first clamp 5100 and the second clamp 5200 are close to each other to clamp the first body 4300 and the second body 4200, and the releasing position is defined as a position where the first clamp 5100 and the second clamp 5200 are spaced apart from the first body 4300 and the second body 4200. The first clamp 5100 and the second clamp 5200 are combined with each other in the locking position to have an annular ring shape.

Figure 10:
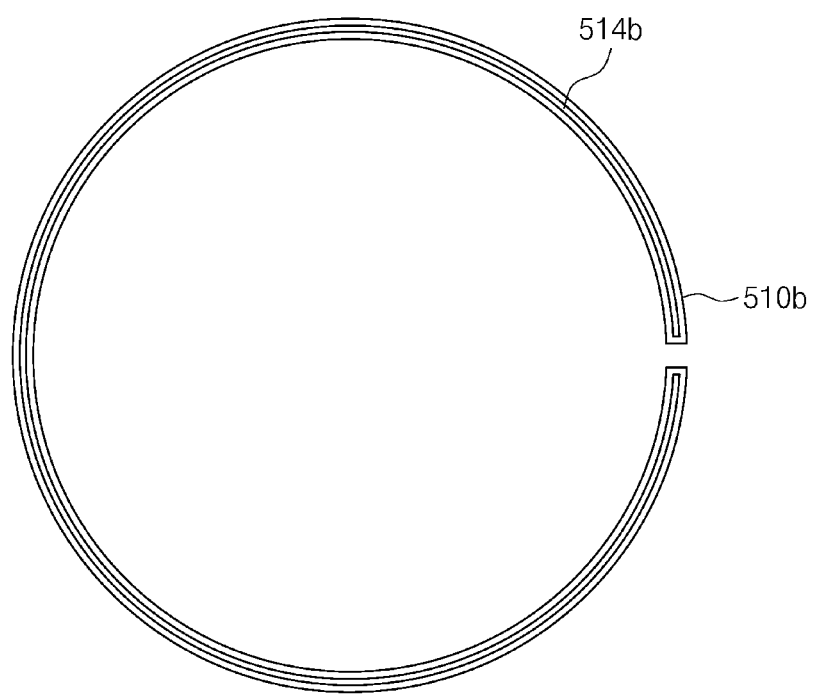
FIG. 10 is a plan view schematically illustrating an appearance of the friction prevent member of FIG. 9.

A friction prevention member 510b may be provided between the first clamp 5100 and the second clamp 5200. For example, as illustrated in FIG. 9, the friction prevention member 510b may be provided on the upper surface and the lower surface in contact with the first clamp 5100 and the second clamp 5200. In the exemplary embodiment, the friction prevention member 510b may be provided in a ring shape as illustrated in FIG. 10. In the exemplary embodiment, the friction prevention member 510b may be provided in an opened shape.

The foregoing detailed description illustrates the present invention. Further, the above content shows and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. Further, the accompanying claims should be construed to include other exemplary embodiments as well.

What is claimed is:

1. An apparatus for treating a substrate comprising:
   a process chamber configured to have a first body and a second body which are combined with each other to have a treating space in which the substrate is treated; and
   a friction prevention member placed on a contact surface between the first body and the second body,
   wherein the friction prevention member has a groove formed at a surface corresponding to the contact surface,
   wherein an adhesive for adhering the friction prevention member to the first body or adhering the friction prevention member to the second body is provided in the groove, and
   wherein the groove is an open-end pattern in which a first end of the groove is adjacent to a second end of the groove.

2. The apparatus for treating the substrate of claim 1, wherein the friction prevention member has a through hole formed in a region where the groove is not provided.

3. The apparatus for treating the substrate of claim 1, wherein the open-end pattern forms a closed region between the first end and the second end.

4. The apparatus for treating the substrate of claim 3, wherein the closed region is formed with a through hole that penetrates the friction prevention member.

5. The apparatus for treating the substrate of claim 1, wherein the friction prevention member is processed with roughness of the surface corresponding to the contact surface.

6. The apparatus for treating the substrate of claim 1, wherein a compressive stress of the friction prevention member is greater than a force received by the friction prevention member.

7. The apparatus for treating the substrate of claim 1, wherein adhesion between the adhesive and the friction prevention member is provided greater than adhesion between the adhesive and the contact surface.

8. An apparatus for treating a substrate comprising:
   a process chamber configured to have a first body and a second body which are combined with each other to have a high-pressure treating space in which the substrate is treated;
   a driver configured to move the process chamber to one of an opening position and a closing position;
   a support unit configured to support the substrate in the high-pressure treating space;
   a fluid supply unit configured to supply a fluid to the high-pressure treating space; and
   a friction prevention member provided on a first surface of the process chamber,
   wherein the first surface includes a contact surface between the first body and the second body,
   wherein the friction prevention member has a groove formed at a surface corresponding to the contact surface,
   wherein an adhesive for adhering the friction prevention member to the first body or adhering the friction prevention member to the second body is provided in the groove, and
   wherein the groove is an open-end pattern in which a first end of the groove is adjacent to a second end of the groove.

9. The apparatus for treating the substrate of claim 8, wherein the open-end pattern forms a closed region between the first end and the second end.

10. The apparatus for treating the substrate of claim 9, wherein the closed region is formed with a through hole that penetrates the friction prevention member.

11. The apparatus for treating the substrate of claim 8, wherein the friction prevention member has a through hole formed in a region where the groove is not provided.

12. The apparatus for treating the substrate of claim 8, wherein the friction prevention member is provided in an arc shape.

13. The apparatus for treating the substrate of claim 8, wherein the driver is provided with a cylinder which penetrates the first body and the second body and elevates any one of the first body and the second body, and
   wherein the friction prevention member is provided to cover the cylinder.

14. The apparatus for treating the substrate of claim 8, wherein the friction prevention member is processed with roughness of the surface corresponding to the first surface.

15. The apparatus for treating the substrate of claim 8, wherein the process chamber is provided with a metallic material.

16. The apparatus for treating the substrate of claim 8, wherein a compressive stress of the friction prevention member is greater than a force received by the friction prevention member.

17. The apparatus for treating the substrate of claim 8, wherein adhesion between the adhesive and the friction prevention member is provided greater than adhesion between the adhesive and the first surface.

18. The apparatus for treating the substrate of claim 8, further comprising:
a clamping member configured to clamp the first body and the second body placed in the closing position,
wherein the friction prevention member is provided between the first body and the clamping member and between the second body and the clamping member, and
wherein the surface includes a contact surface between the first body and the clamping member and a contact surface between the second body and the clamping member.

19. The apparatus for treating the substrate of claim 18, wherein the friction prevention member is provided in a ring shape.

20. The apparatus for treating the substrate of claim 18, wherein the treating of the substrate is drying the substrate using a supercritical fluid in the treating space.

* * * * *